US009502542B2

(12) United States Patent
Wen et al.

(10) Patent No.: US 9,502,542 B2
(45) Date of Patent: Nov. 22, 2016

(54) FINFET TRANSISTOR WITH FIN BACK BIASING

(71) Applicant: Taiwan Semiconductor Manufacturing Company, Ltd., Hsin-Chu (TW)

(72) Inventors: Tsung-Yao Wen, Hsin-Chu (TW); Sai-Hooi Yeong, Hsin-Chu (TW); Sheng-Chen Wang, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/574,497

(22) Filed: Dec. 18, 2014

(65) Prior Publication Data

US 2016/0181404 A1  Jun. 23, 2016

(51) Int. Cl.
*H01L 27/088* (2006.01)
*H01L 29/66* (2006.01)

(52) U.S. Cl.
CPC ..... *H01L 29/66818* (2013.01); *H01L 27/0886* (2013.01)

(58) Field of Classification Search
CPC ................................. H01L 29/66818
USPC ........................................ 257/401
See application file for complete search history.

(56) References Cited

U.S. PATENT DOCUMENTS

| 8,487,378 | B2 | 7/2013 | Goto et al. |
| 8,729,634 | B2 | 5/2014 | Shen et al. |
| 8,826,213 | B1 | 9/2014 | Ho et al. |
| 8,887,106 | B2 | 11/2014 | Ho et al. |
| 2014/0282326 | A1 | 9/2014 | Chen et al. |
| 2016/0056295 | A1* | 2/2016 | Wen ..................... H01L 29/7856 257/369 |

OTHER PUBLICATIONS

C.H. Lin et al., "Channel Doping Impact on FinFETs for 22nm and Beyond," 2012 Symposium on VLSI Technology Digest of Technical Papers, pp. 15-16, NY, USA, (2012).
Hyunjin Lee, "A Study of Negative-Bias Temperature Instability of SOI and Body-Tied FinFETs," IEEE Electron Device Letters, vol. 1, 26, No. 5, May 2005, pp. 326-328.

\* cited by examiner

*Primary Examiner* — Anthony Ho
(74) *Attorney, Agent, or Firm* — Haynes and Boone, LLP

(57) ABSTRACT

A FinFET having fin back biasing and methods of forming the same are disclosed. The FinFET includes a substrate and a fin over the substrate. The fin includes a source region, a drain region, a channel region, and a biasing region. The source and drain regions sandwich the channel region. The channel region and the biasing region sandwich one of the source and drain regions. The FinFET further includes a gate over the substrate. The gate engages the fin adjacent to the channel region, thereby forming a field effect transistor (FET). The biasing region is configured to bias the FET body effect when a voltage is applied to the biasing region. From a cross sectional view, the source region and the biasing region each have a substantially rectangular profile, wherein the source region is taller and wider than the biasing region.

20 Claims, 22 Drawing Sheets

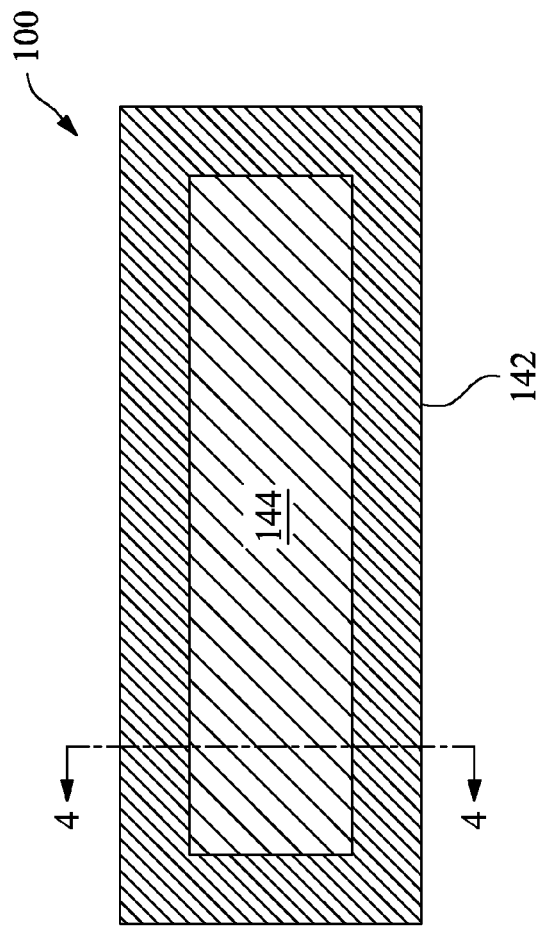
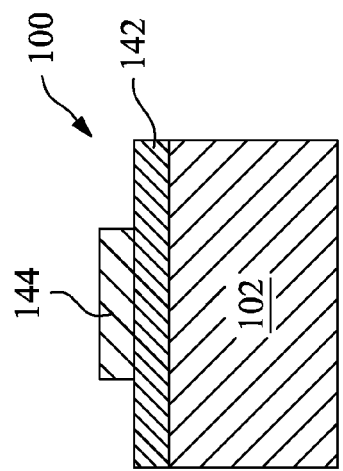
FIG. 3A
FIG. 3B

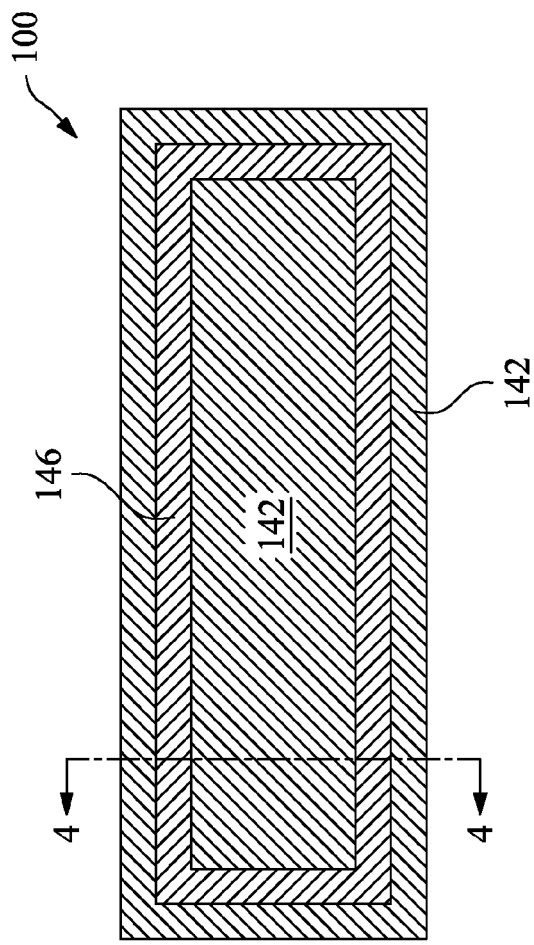
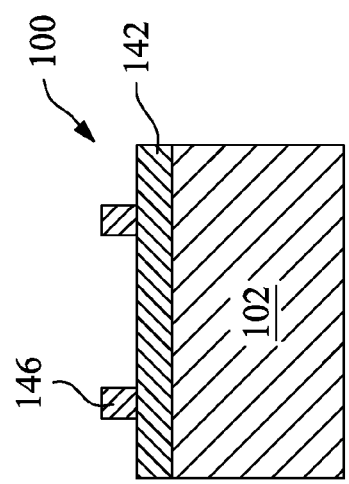
FIG. 5A
FIG. 5B

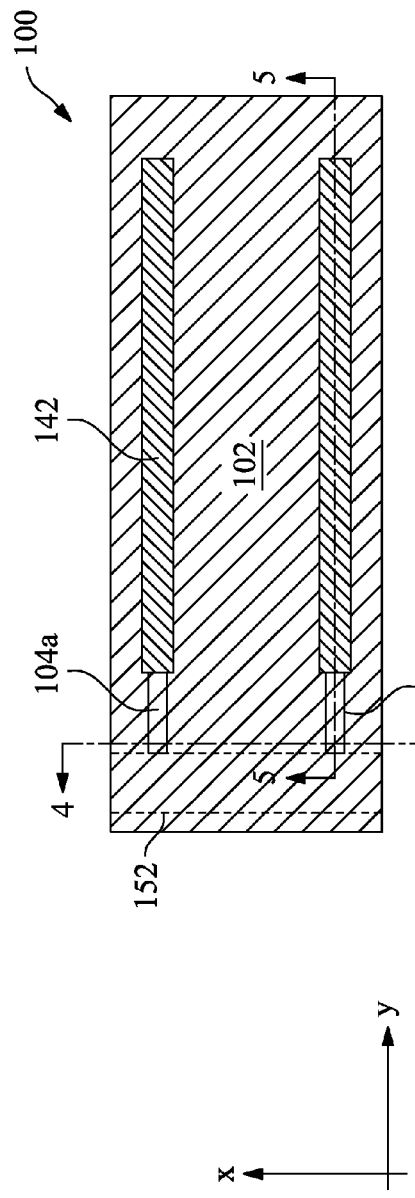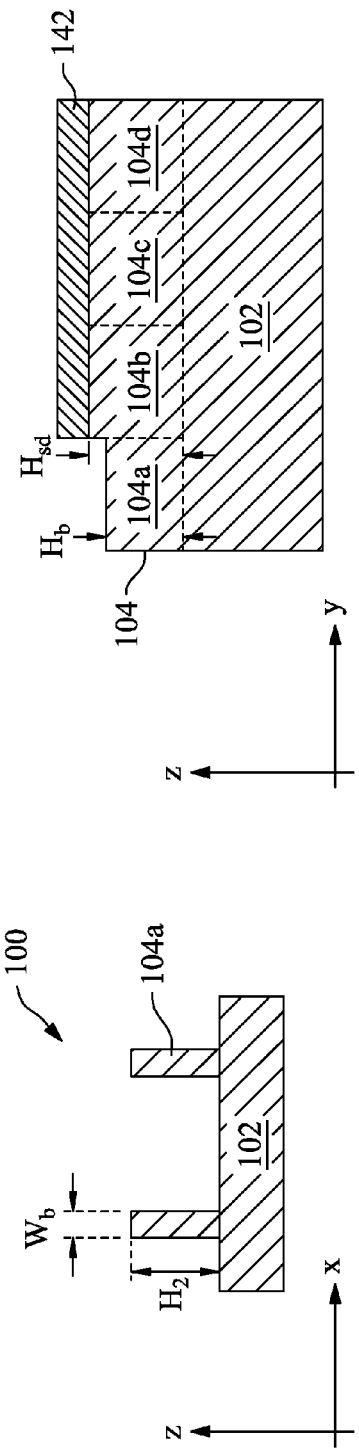
FIG. 10A
FIG. 10B
FIG. 10C

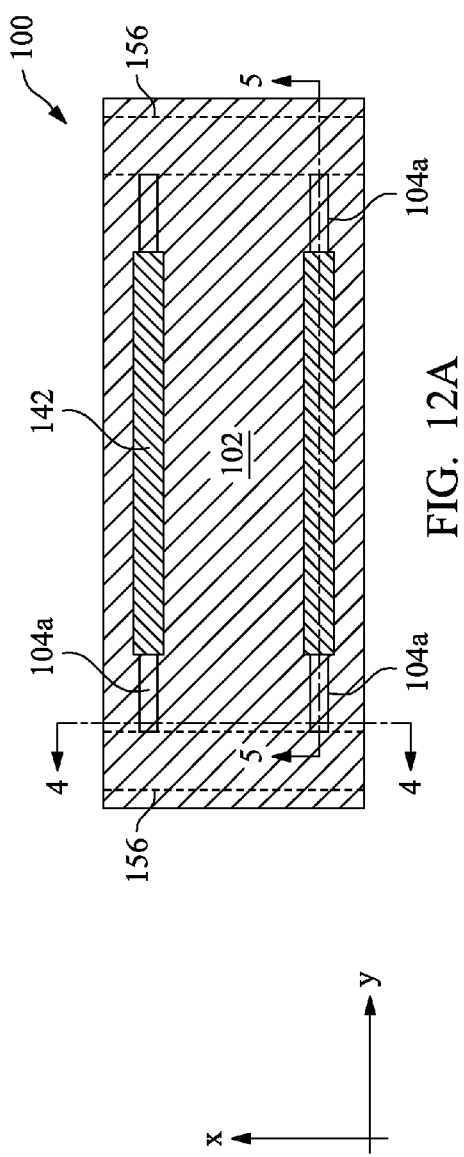
FIG. 12A
FIG. 12B
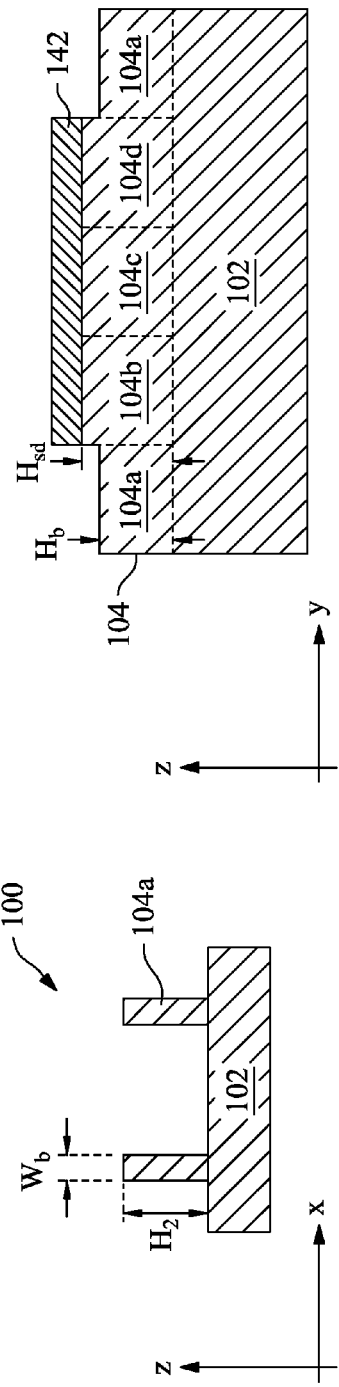
FIG. 12C

FINFET TRANSISTOR WITH FIN BACK BIASING

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, body biasing has been used in traditional process nodes for modulating gate threshold voltage of a transistor. However, body biasing effect has diminished with transistor scaling down. Particularly, in fin field effect transistors (FinFETs), there has not been an effective way of adding body biasing due to geometric limitations. A FinFET typically includes a narrow and tall silicon wall (the "fin") over a substrate, and further includes a gate engaging the fin on two or three sides thereof. The FinFET's conductive channel is formed on surfaces of the fin adjacent to the gate. Any biasing added to the substrate is unlikely to have any effect on the FinFET's gate threshold voltage and the so-called "body effect" is virtually absent in the FinFET. Accordingly, what is needed is a way of adding effective body biasing to a FinFET.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-12C are top and cross-sectional views of the semiconductor device at various fabrication steps of the method in FIGS. 2A-2D, in accordance with some embodiments.

DETAILED DESCRIPTION

Figure 1A:
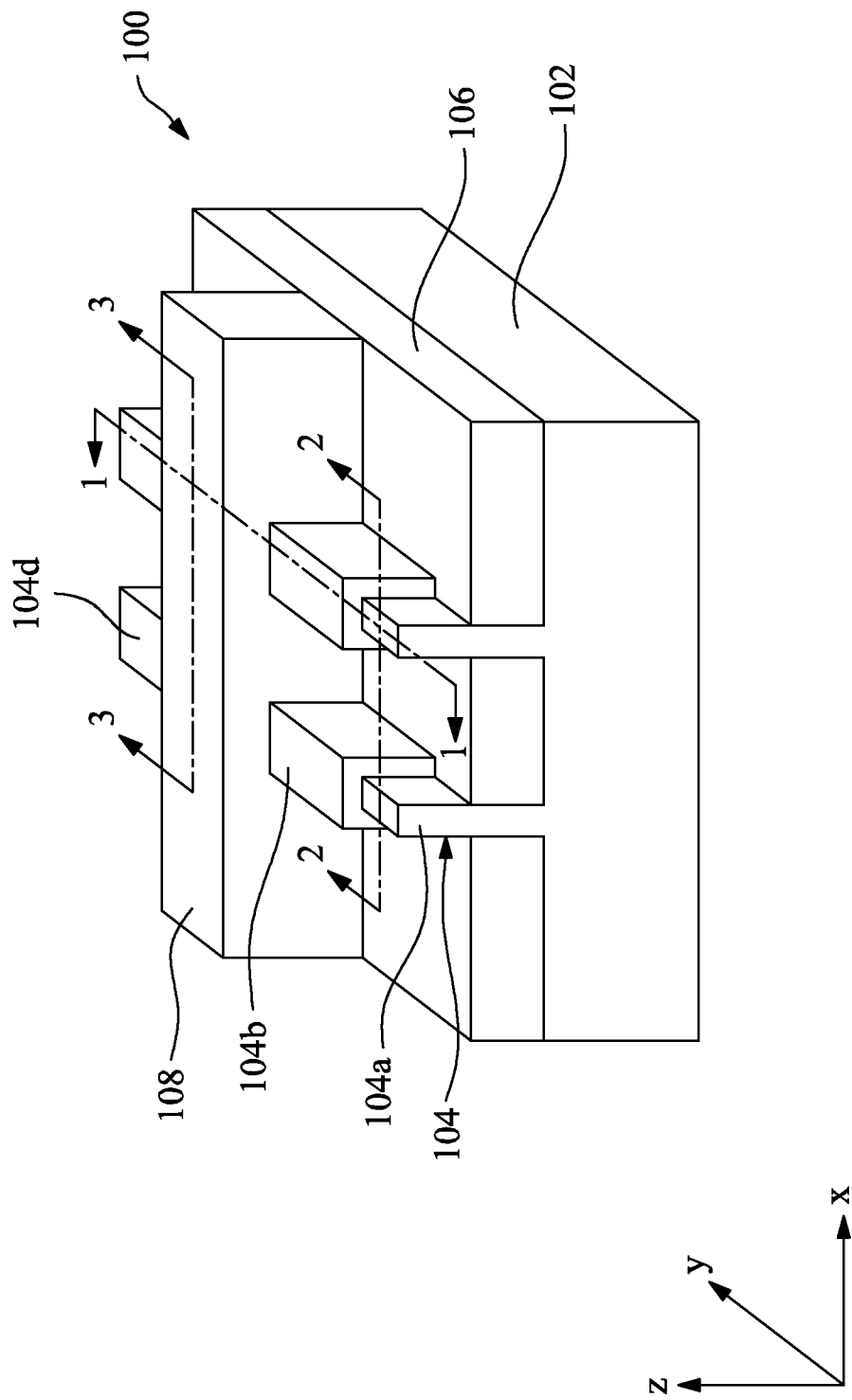
FIG. 1A is a perspective and schematic view of a portion of a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to semiconductor devices having FinFETs. It is an objective of the present disclosure to provide methods for effectively adding body-biasing to a FinFET.

Referring to FIG. 1A, shown therein is a portion of a semiconductor device 100 constructed according to various aspects of the present disclosure. The device 100 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

The device 100 and methods of making the same will be described below in accordance with embodiments of the present disclosure. However, the present disclosure is not limited by specific configurations of the device 100. Embodiments of the present disclosure may include different types of devices, different number of devices, and/or different configuration of structures.

With continued reference to FIG. 1A, the device 100 includes a substrate 102, two fins 104 projecting upwardly from the substrate 102, an isolation structure 106 over the substrate 102, and a gate 108 engaging both the fins 104.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) such as a buried dielectric layer.

The fin 104 is suitable for forming a p-type FinFET in an embodiment or an n-type FinFET in an alternative embodiment. It includes four portions (or sections): 104a, 104b, 104c (not shown in FIG. 1A, but shown in FIG. 1B), and 104d. Specifically, the portions 104b/c/d comprise a main body of the fin 104 while the portion 104a comprises a shrunk portion of the fin 104. This is further illustrated in FIGS. 1B and 1C.

Figure 1B:
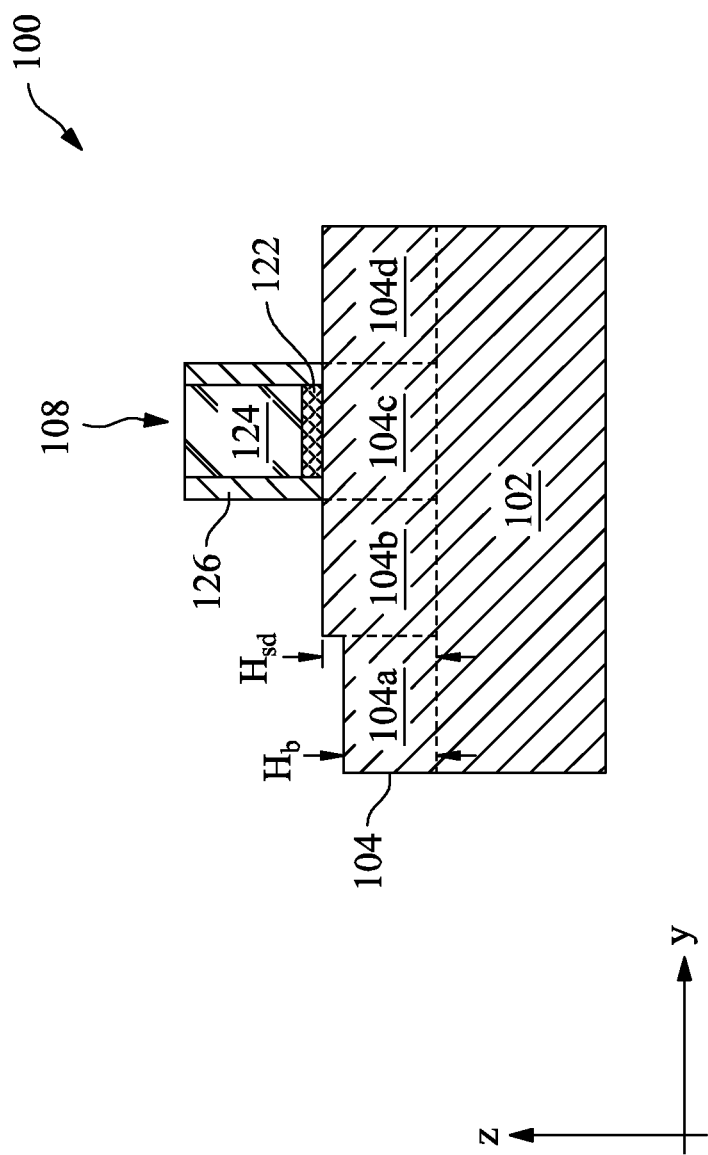
FIGS. 1B and 1C illustrate cross sectional views of the semiconductor device of FIG. 1A, in accordance with some embodiments.

FIG. 1B shows a cross sectional view of the semiconductor device 100 along the 1-1 line of FIG. 1. FIG. 1C shows cross sectional views of the semiconductor device 100 along the 2-2 line and the 3-3 line of FIG. 1A simultaneously, with the former superimposed onto the latter, showing the relationship between the fin portions 104a and 104b. Referring to FIGS. 1B and 1C collectively, along the "y" direction, the portions 104b and 104d sandwich the portion 104c, and the portions 104a and 104c sandwich the portion 104b. The portion 104a has smaller dimensions than the other three portions in the "x-z" plane. The portions 104b and 104d include p-type or n-type doped source and drain regions of the device 100, while the portion 104c includes a channel region of the device 100. The gate 108, which will be described later, engages the fin 104 adjacent to the portion 104c to form a FinFET. Hereinafter, the portions 104b and 104d are also referred to as the source/drain (S/D) regions 104b and 104d, while the portion 104c is also referred to as the channel region 104c. In the present embodiment, the portion 104a is a body-biasing region for the FinFET 100, and it is therefore also referred to as the biasing region 104a. In addition, the semiconductor device 100 is also referred to as the FinFET 100. In an embodiment, the region 104b is a source region of the FinFET 100 and the region 104d is a drain region of the FinFET 100. In an alternative embodiment, the region 104b is a drain region of the FinFET 100 and the region 104d is a source region of the FinFET 100. In the embodiment as shown, the gate 108 engages the fin 104 on three sides thereof. In an alternative embodiment, the gate 108 engages the fin 104 on two sides thereof but not on its top surface.

Figure 1C:
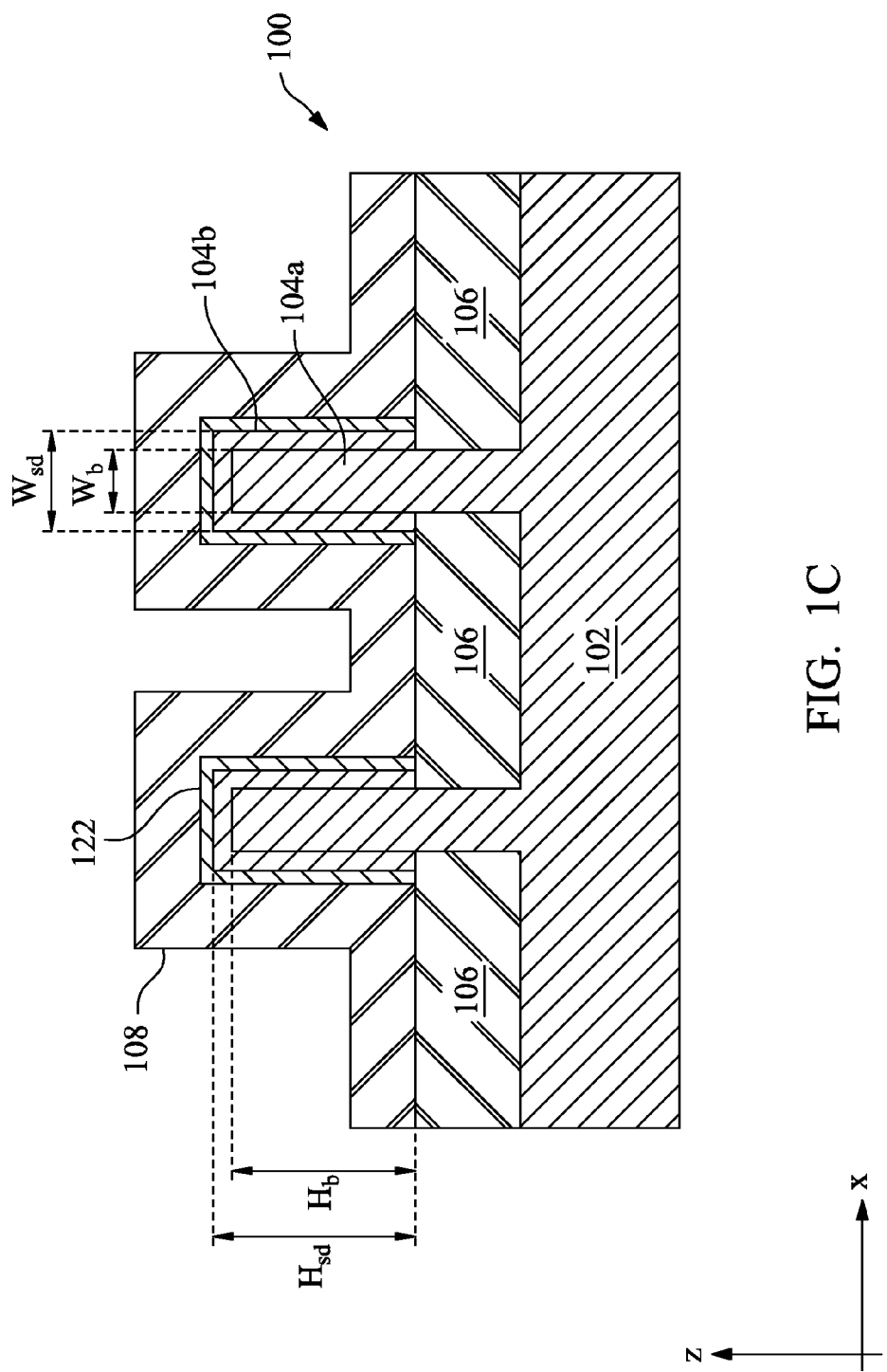

Referring to FIG. 1C, in the present embodiment, the main body of the fin 104 and the biasing region 104a each have a rectangular profile in the "x-z" plane. The main body of the fin 104 has a fin height $H_{sd}$ and a fin width $W_{sd}$. The biasing region 104a has a fin height $H_b$ and a fin width $W_b$. In various embodiments, $H_b$ is less than $H_{sd}$ and $W_b$ is less than $W_{sd}$. In an embodiment, $W_b$ is about three fifths (3/5) to about two thirds (2/3) of $W_{sd}$. In the present embodiment, the biasing region 104a is at one end of the fin 104. Alternatively, the biasing region 104a may be formed in a relatively inside portion of the fin 104. The process of forming the fin 104 will be described later.

In an embodiment, the S/D regions 104b and 104d are doped with a p-type dopant for forming a p-type FinFET. In another embodiment, the S/D regions 104b and 104d are doped with an n-type dopant for forming an n-type FinFET. The S/D regions 104b and 104d may be processed by halo or lightly doped drain (LDD) implantation, source/drain implantation, source/drain activation and/or other suitable processes. In some embodiments, the S/D regions 104b and 104d may include raised regions, strained regions, epitaxially grown regions, and/or other suitable S/D features. In an embodiment, the S/D regions 104b and 104d and the biasing region 104a may each include silicidation. Silicidation can be formed by a process that includes depositing a metal layer, annealing the metal layer such that the metal layer is able to react with silicon to form silicide, and then removing the non-reacted metal layer.

The isolation structure 106 laterally isolates the fins 104 from each other and from other structures (not shown) on the substrate 102. The isolation structure 106 may be formed of silicon oxide, silicon nitride, silicon oxynitride, fluoride-doped silicate glass (FSG), a low-k dielectric material, and/or other suitable insulating material. The isolation structure 106 may be shallow trench isolation (STI) features. In an embodiment, the isolation structure 106 is formed by etching trenches in the substrate 102, e.g., as part of the fin 104 formation process. The trenches may then be filled with isolating material, followed by a chemical mechanical planarization (CMP) process and an etching process to recess the isolating material lower than a top surface of the fin 104. Other isolation structure 106 such as field oxide, LOCal Oxidation of Silicon (LOCOS), and/or other suitable structures are possible. The isolation structure 106 may include a multi-layer structure, for example, having one or more thermal oxide liner layers.

Still referring to FIGS. 1B and 1C collectively, the gate 108 is a multi-layer structure. In the embodiment as shown, the gate 108 includes an interfacial layer 122 and a poly-silicon (or poly) layer 124 over the interfacial layer 122. As shown in FIG. 1B, a gate spacer 126 wraps around the poly layer 124 and the interfacial layer 122 and protects the approximately vertical sides of those layers. For the convenience of discussion, the gate spacer 126 is considered as part of the gate 108 in the following discussion. In some embodiments, the gate 108 may further include a gate dielectric layer and a metal gate layer disposed between the interfacial layer 122 and the poly layer 124. In some embodiments, the gate 108 includes one or more metal layers in place of the poly layer 124.

In various embodiments, the interfacial layer 122 includes a dielectric material such as silicon oxide ($SiO_2$) or silicon oxynitride (SiON), and can be formed by chemical oxidation, thermal oxidation, atomic layer deposition (ALD), chemical vapor deposition (CVD), and/or other suitable methods. The poly layer 124 can be formed by suitable deposition processes such as low-pressure chemical vapor deposition (LPCVD) and plasma-enhanced CVD (PECVD). The gate dielectric layer may use a high-k dielectric material such as hafnium oxide ($HfO_2$), $Al_2O_3$, lanthanide oxides, $TiO_2$, HfZrO, $Ta_2O_3$, $HfSiO_4$, $ZrO_2$, $ZrSiO_2$, combinations thereof, or other suitable material; and may be formed by ALD and/or other suitable methods. The metal gate layer may include a p-type work function metal or an n-type work function metal, and may be deposited by CVD, PVD, and/or other suitable process. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The one or more metal layers may use aluminum (Al), tungsten (W), copper (Cu), cobalt (Co), and/or other suitable materials; and may be formed by CVD, PVD, plating, and/or other suitable processes.

The gate spacer 126 may include materials such as silicon nitride, silicon oxide, silicon oxynitride, and/or other suitable dielectric. The gate spacer 126 may be formed using suitable deposition and etching techniques and may include a single layer or any plurality of layers. For example, the gate spacer 126 may include a seal gate spacer and a dummy gate spacer. In some cases, the gate spacer 126 may be used for offset and self-align purposes when the S/D regions 104b and 104d are doped.

Figure 1D:
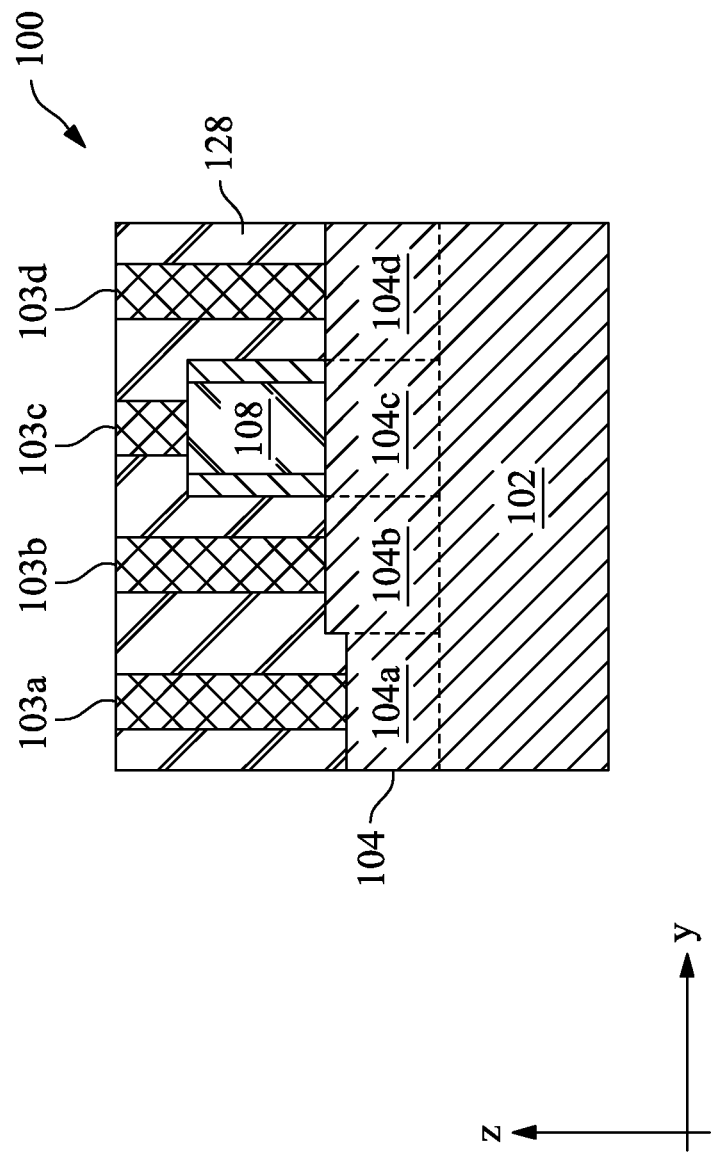
FIG. 1D illustrates a cross sectional view of the semiconductor device of FIG. 1A after further fabrication stages, in accordance with some embodiments.

FIG. 1D illustrates a cross sectional view of the FinFET 100 after further fabrication stages, in accordance with some embodiments. Referring to FIG. 1D, one or more dielectric layers 128, such as an inter-layer dielectric (ILD) layer, are formed over the substrate, covering the fin 104 and the gate 108. Conductive features 130a-d are formed in the dielectric layers 128. Specifically, the conductive features 130a, 130b, 130c, and 130d electrically connect the biasing region 104a, the first S/D region 104b, the gate 108, and the second S/D region 104d respectively to other parts of the semiconductor device to form an integrated circuit (IC). Each of the conductive features 130a-d may include metal contacts and metal vias.

During an exemplary operation of the FinFET 100, a voltage $V_G$ is applied across the gate 108 and the source 104b (or 104d) through the various conductive features. When the voltage $V_G$ is below a threshold voltage $V_t$, the FinFET 100 is turned off, i.e., there is negligible or no current from the drain region 104d to the source region 104b of the FinFET 100. When the voltage $V_G$ is above the threshold voltage $V_t$, a conductive path is formed underneath the gate 108, thereby turning the FinFET 100 on (i.e., charges flow from drain to source). In the embodiment as shown in FIG. 1C, the conductive path is formed underneath the interfacial layer 122 on three sides of the channel region 104c. In various embodiments of the present disclosure, a biasing voltage $V_B$ is applied across the biasing region 104a and the source region 104b through the various conductive features. This biasing voltage $V_B$ influences the threshold voltage $V_t$, thereby creating a biasing effect to the FinFET 100. In an example, increasing (or decreasing) the voltage $V_B$ proportionally increases (or decreases) the voltage $V_t$. Therefore, by controlling the biasing voltage $V_B$, the biasing region 104a can be configured to bias the FinFET 100 into operation. Since the biasing region 104a is in close proximity to the source region 104b, the biasing effect is much greater than having a biasing terminal connected to the substrate 102. In various embodiments of the present disclosure, a biasing effect of more than 10 mV/V can be achieved, comparable to those in the traditional planar devices. In addition, due to its profile (i.e., biasing region as part of fin body) and position relative to the source (or drain) region 104b as shown in FIG. 1C, the biasing region 104a provides biasing effect to all three sides of the channel region 104c.

Still referring to FIG. 1D, in an embodiment, the dielectric layers 128 are formed by one or more flowable CVD (FCVD) processes. The FCVD process includes depositing a flowable material (such as a liquid compound) on the substrate 102 to fill the trenches and converting the flowable material to a solid material by a suitable technique, such as annealing in one example. Alternatively, the dielectric layers 128 may be formed by other suitable methods. After the dielectric layers 128 are formed, one or more etching process is performed to etch the dielectric layers 128 to form openings through which the regions 104a/b/d and the gate 108 are exposed. In an embodiment, a barrier layer is formed on the sidewalls of the openings, and a conductive material is subsequently filled in the remaining space of the openings, forming the conductive features 130a-d. In an embodiment, the conductive features 130a-d use a conductive material such as aluminum (Al), tungsten (W), copper (Cu), cobalt (Co), combinations thereof, or other suitable material; and can be deposited using a suitable process, such as CVD, PVD, plating, and/or other suitable processes. A CMP process may be performed to planarize the top surface of the conductive features 130a-d.

FIGS. 2A-2D show a method 200 of forming a semiconductor device, such as the FinFET 100, according to various aspects of the present disclosure. Specifically, the method 200 uses a double patterning method to form fins, such as the fins 104. However, the method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 1A-1D discussed above and FIGS. 3A-12C discussed below. Specifically, FIGS. 3A-12A are top views of the semiconductor device 100, FIGS. 3B-12B are cross sectional views of the semiconductor device 100 along the "4-4" line in the respective FIGS. 3A-12A, and FIGS. 10C and 12C are cross sectional views of the semiconductor device 100 along the "5-5" line in the respective FIGS. 10A and 12A.

At operation 202 (FIG. 2A), the method 200 is provided with a substrate 102 (FIG. 3B). Referring to FIG. 3B, the substrate 102 may be a silicon substrate and may include one or more material layers, as discussed above with reference to FIG. 1A.

At operation 204 (FIG. 2A), the method 200 forms a mandrel pattern 144 over the substrate 102 (FIGS. 3A and 3B). Referring to FIGS. 3A and 3B, the mandrel pattern 144 is a line pattern in the present embodiment and may be a trench pattern in another embodiment. In the present embodiment, the mandrel pattern 144 is formed over a hard mask layer 142 over the substrate 102. In an example, the hard mask layer 142 is formed using a deposition process and may include one or more layers of material such as silicon oxide and/or silicon nitride. In an example, the mandrel pattern 144 is formed using a process that includes a deposition process, a photolithography process, and an etching process. For example, the deposition process may form one or more layers of material or composition over the hard mask layer 142. The photolithography process may include resist coating, soft baking, exposing, post-exposure baking, developing, and hard baking in one example. In an embodiment, the mandrel pattern 144 is a developed resist. In another embodiment, the mandrel pattern 144 is formed by etching a material layer using a developed resist as an etch mask. The etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 4A:
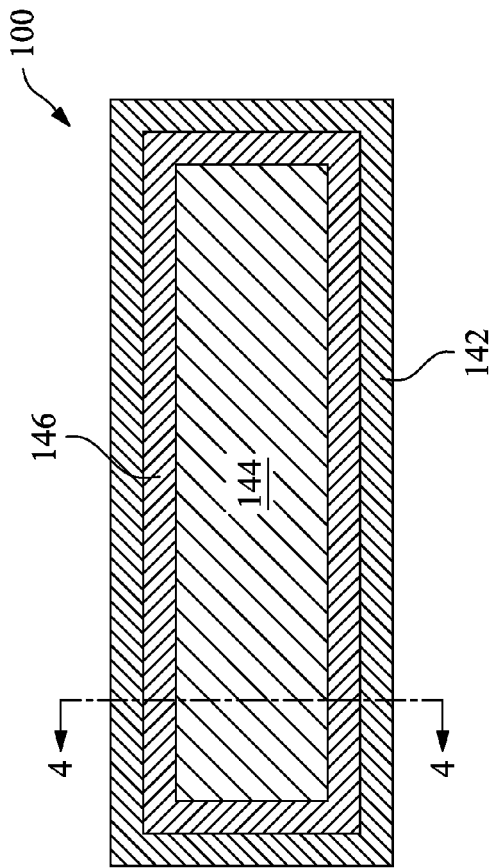
Figure 4B:
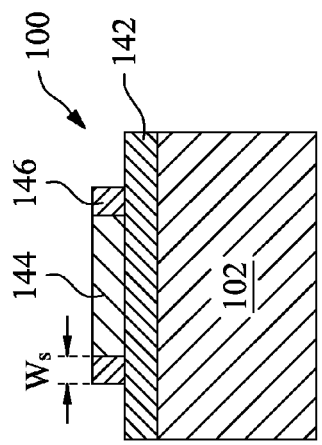

At operation 206 (FIG. 2A), the method 200 forms a spacer pattern 146 around the mandrel pattern 144 and on sidewalls of the mandrel pattern 144 (FIGS. 4A and 4B). Referring to FIGS. 4A and 4B, the spacer pattern 146 has a thickness $W_s$ and includes one or more material different from the mandrel pattern 144. In one embodiment, the spacer pattern 146 may include a dielectric material, such as titanium nitride, silicon nitride, or titanium oxide. The spacer pattern 146 can be formed by various processes, including a deposition process and an etching process. For example, the deposition process includes a chemical vapor deposition (CVD) process or a physical vapor deposition (PVD) process. For example, the etching process includes an anisotropic etch such as plasma etch.

At operation 208 (FIG. 2A), the method 200 removes the mandrel pattern 144 and leaves the spacer pattern 146 over the substrate 102 (FIGS. 5A and 5B). In an embodiment, the mandrel pattern 144 is removed by an etching process selectively tuned to remove the mandrel pattern 144 while the spacer pattern 146 remains substantially unchanged during the etching process, leaving the spacer pattern 146 over the hard mask layer 142 as an etch mask for further processes.

Figure 6A:
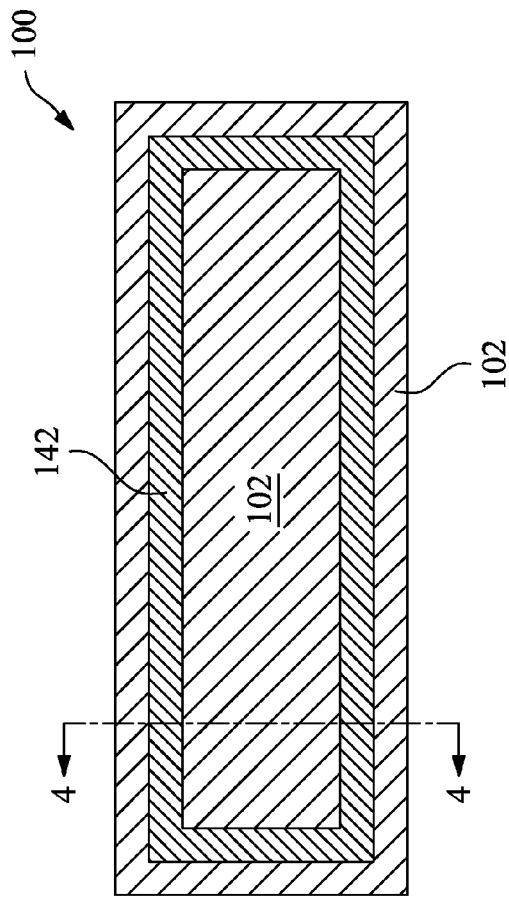
Figure 6B:
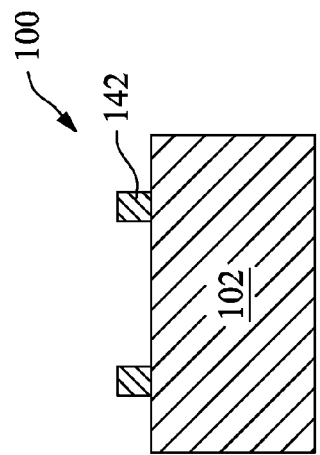
Figure 7A:
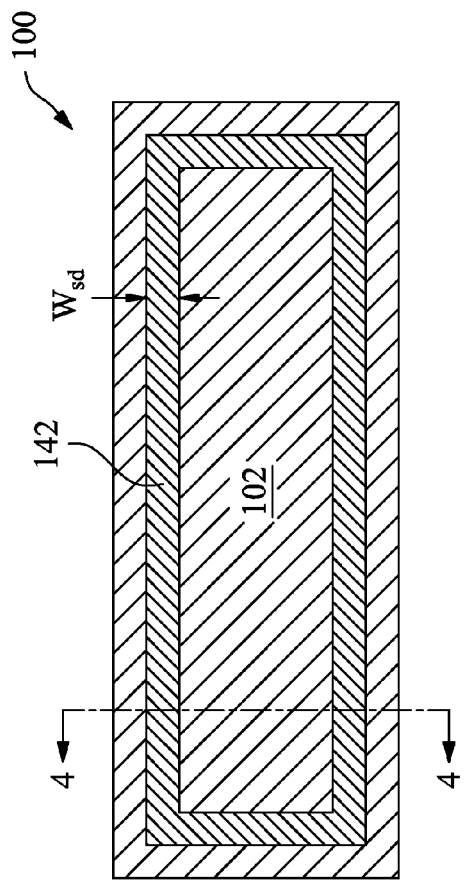
Figure 7B:
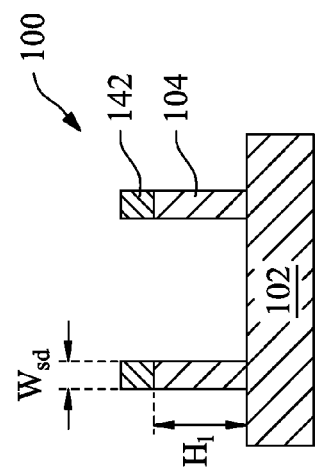

At operation 210 (FIG. 2A), the method 200 transfers the spacer pattern 146 to the substrate 102, forming a projection 104 (FIG. 7B). In the present embodiment, this involves multiple processes. In a first process, the hard mask layer 142 is etched with the spacer pattern 146 as an etch mask. The spacer pattern 146 is thereafter removed, leaving a patterned hard mask layer 142 over the substrate 102 (FIGS. 6A and 6B). In a second process, the substrate 102 is etched with the patterned hard mask 142 as an etch mask, forming the projection 104, where the hard mask layer 142 is partially consumed (FIGS. 7A and 7B). In the present embodiment, the projection 104 is etched to have a height $H_1$ and the etching process may be time-based. The projection height $H_1$ is greater than the fin height $H_{sd}$ in FIG. 1C, leaving room for forming of the isolation structure 106, which will be discussed later. From a top view (FIG. 7A), the projection 104 is a closed loop in the embodiment and its width $W_{sd}$ is about the same as the spacer thickness $W_s$ taking into account some loss of the spacer material during the various etching processes as discussed above. Specifically, the projection 104 has two elongated pieces oriented along the "y" axis and two elongated pieces oriented along the "x" axis. The two elongated pieces along the "x" axis are also referred to as the two "ends" of the projection 104.

Figure 2A:
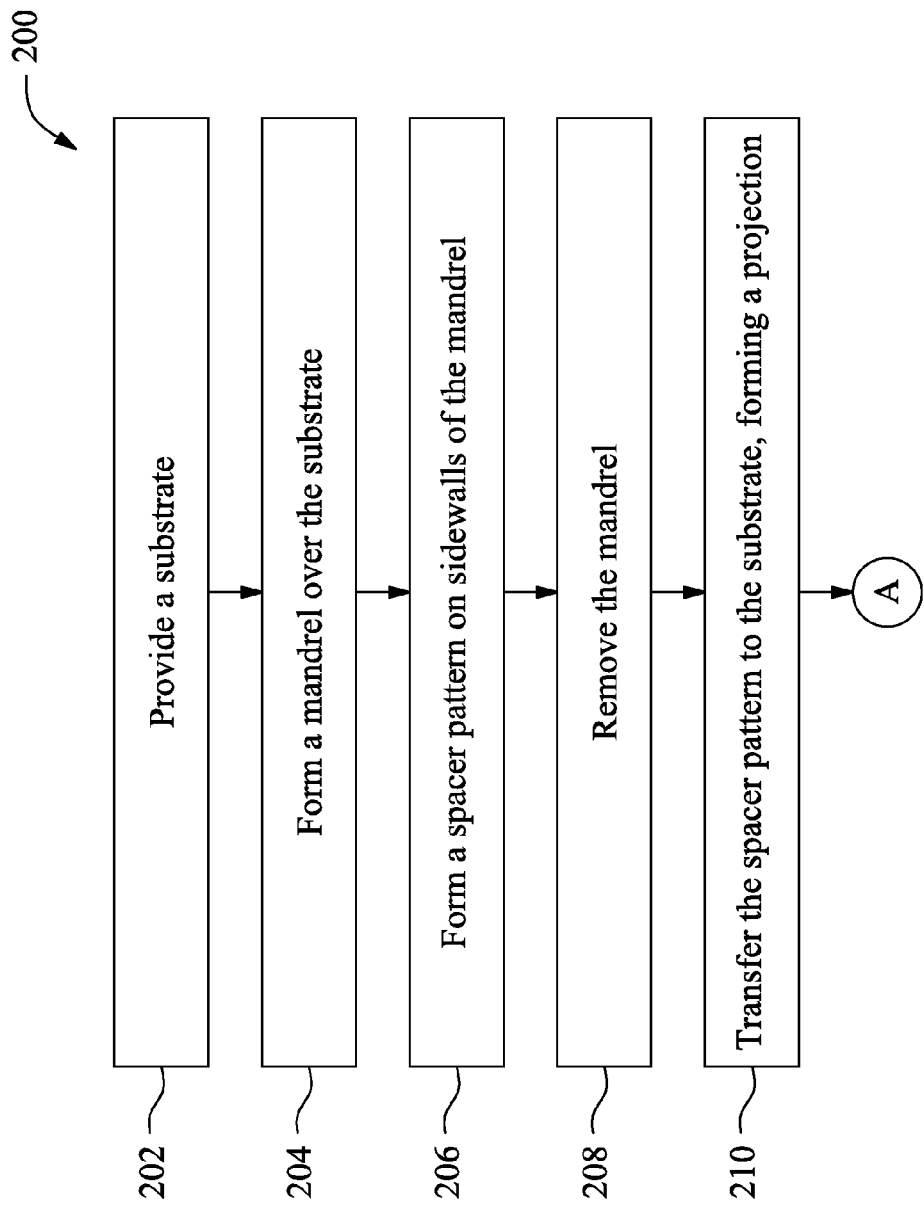
FIGS. 2A-2D show a flow chart of a method of fabricating a semiconductor device, according to various aspects of the present disclosure.
Figure 2B:
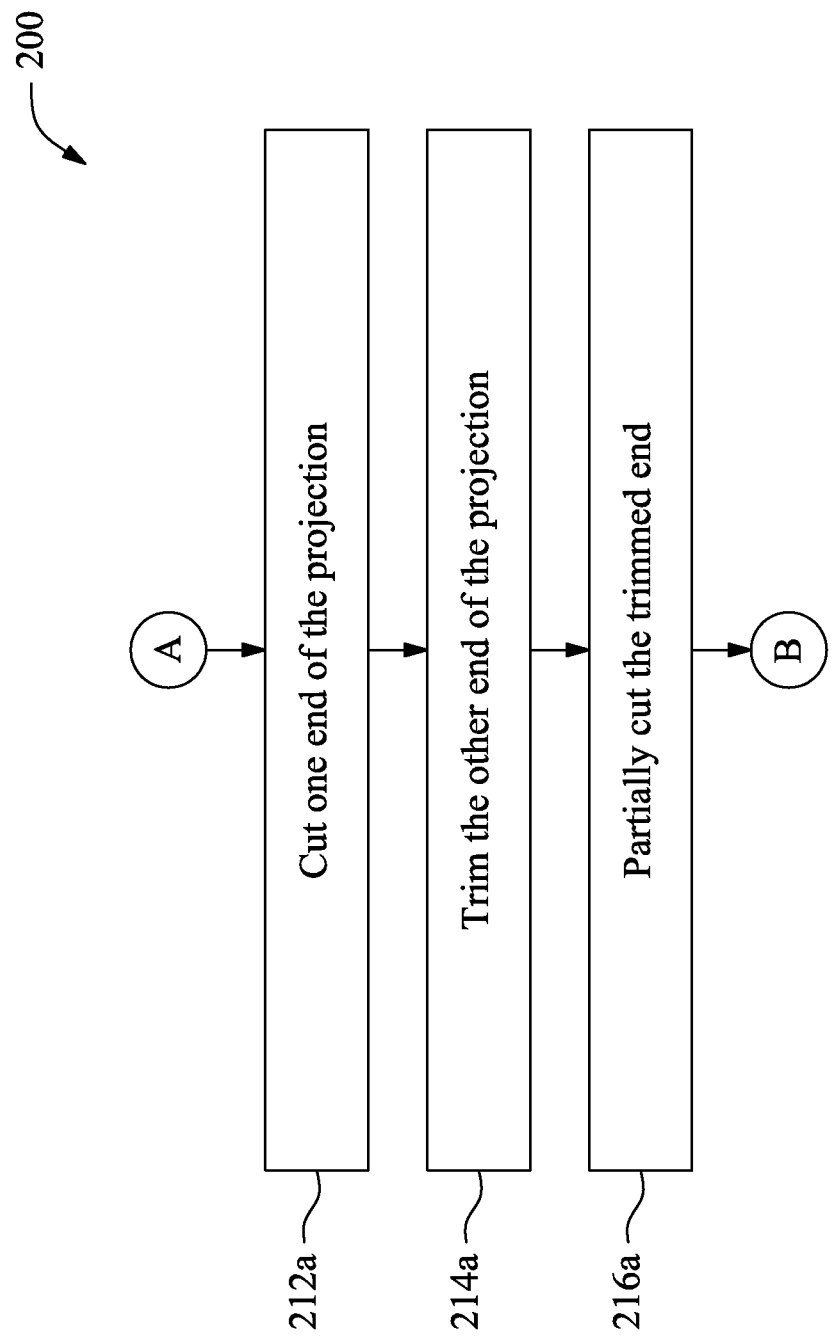
Figure 2C:
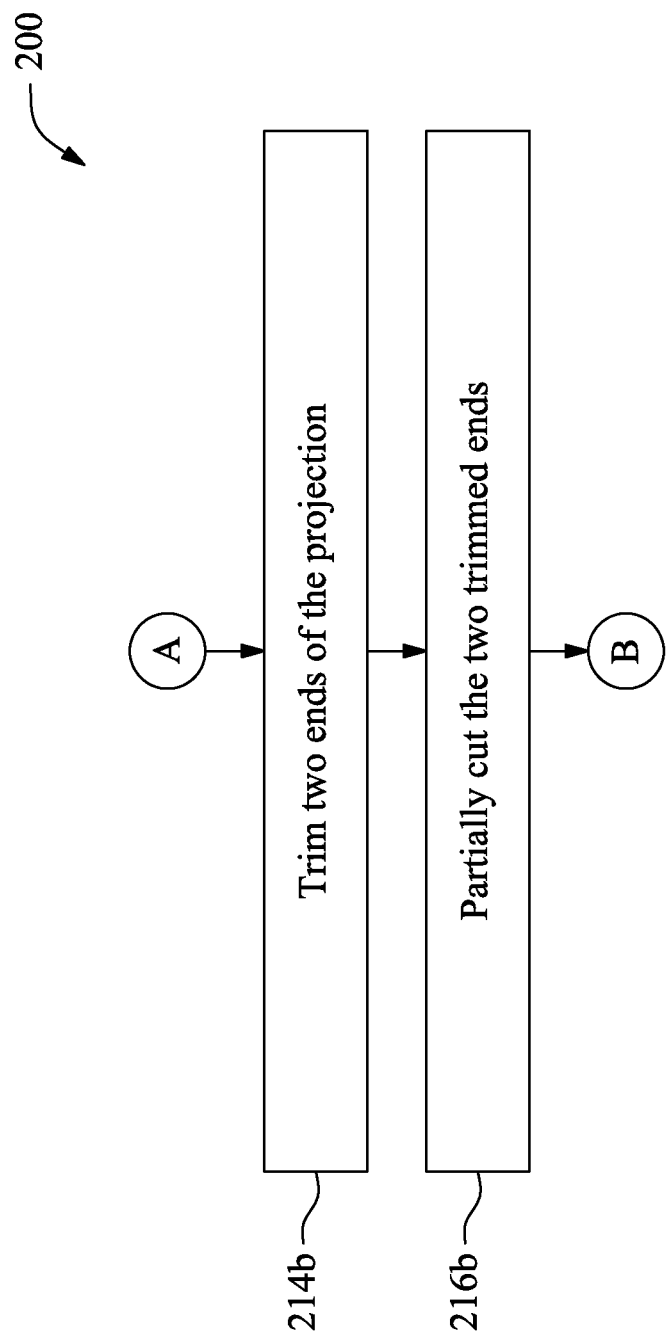
Figure 2D:
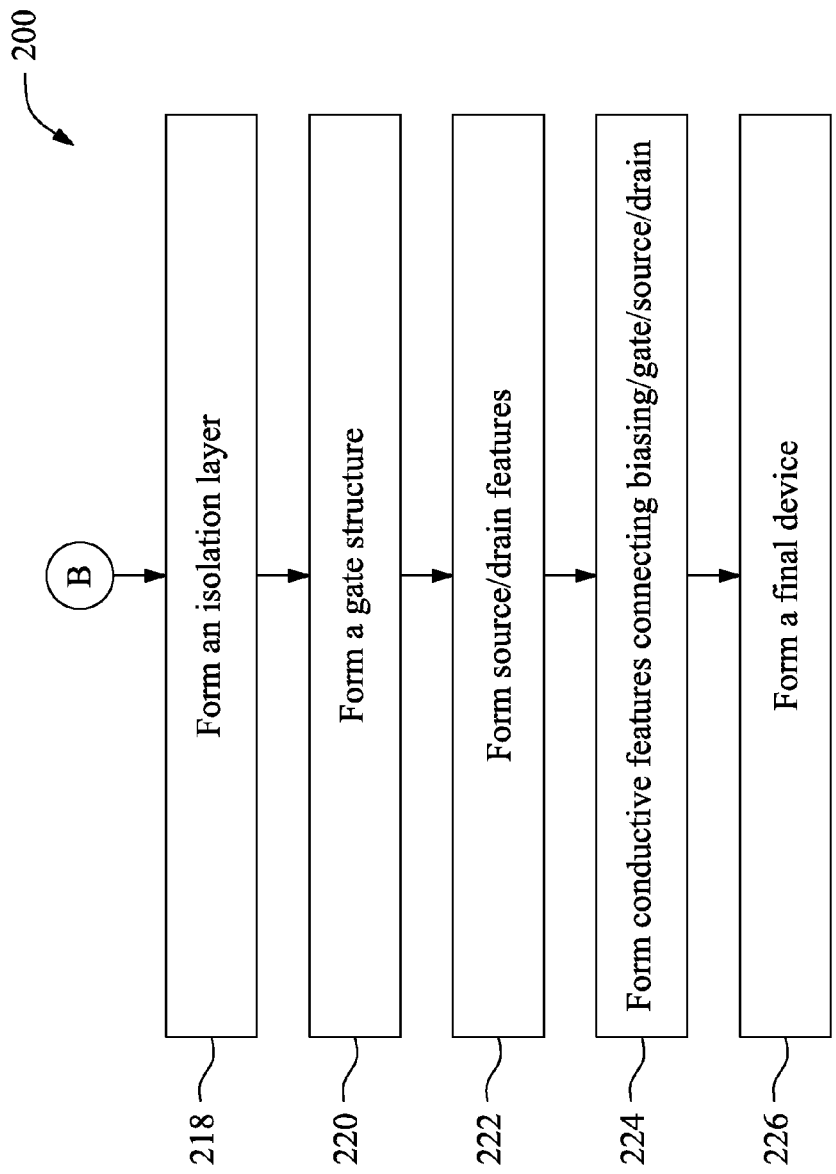

FIGS. 2B and 2C provide alternative embodiments of forming the fin 104 as shown in FIGS. 1A-1C. FIG. 2B will be discussed first in conjunction with FIGS. 8A-10C, followed by discussion of FIG. 2C in conjunction with FIGS. 11A-12C. Other embodiments incorporating the inventive concept of the present disclosure can also be used.

Figure 8A:
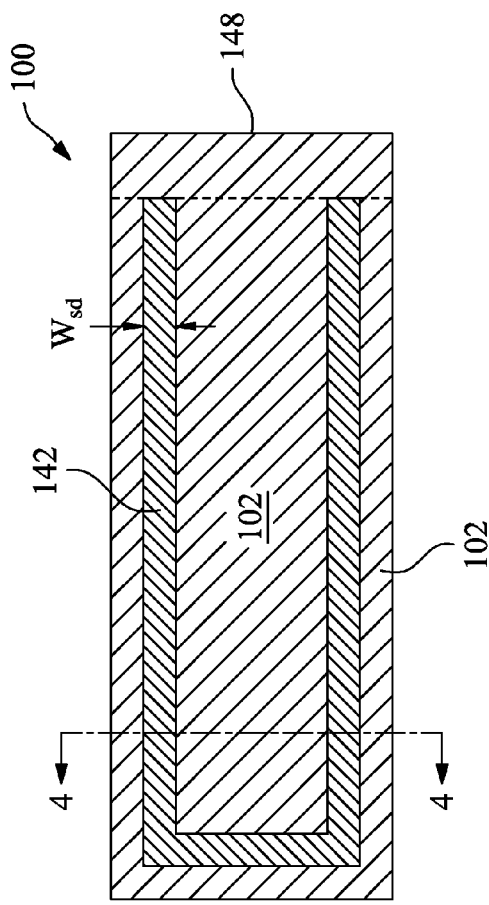
Figure 8B:
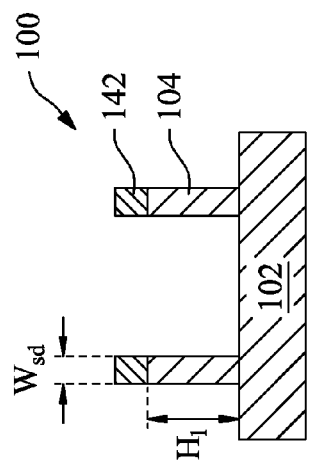

At operation 212a (FIG. 2B), the method 200 cuts one end of the projection 104. Referring to FIG. 8A, a portion of the projection 104, as enclosed by a dotted box 148, is removed. The remaining portion of the projection 104 is still contiguous but it is no longer a closed loop. In an embodiment, operation 212a includes a patterning process and an etching process. For example, the patterning process forms a resist pattern covering the substrate 102, the projection 104, and the patterned hard mask 142 except the respective portions enclosed by the dotted box 148. Then the etching process removes the uncovered portions of the patterned hard mask 142 and the projection 104.

Figure 9A:
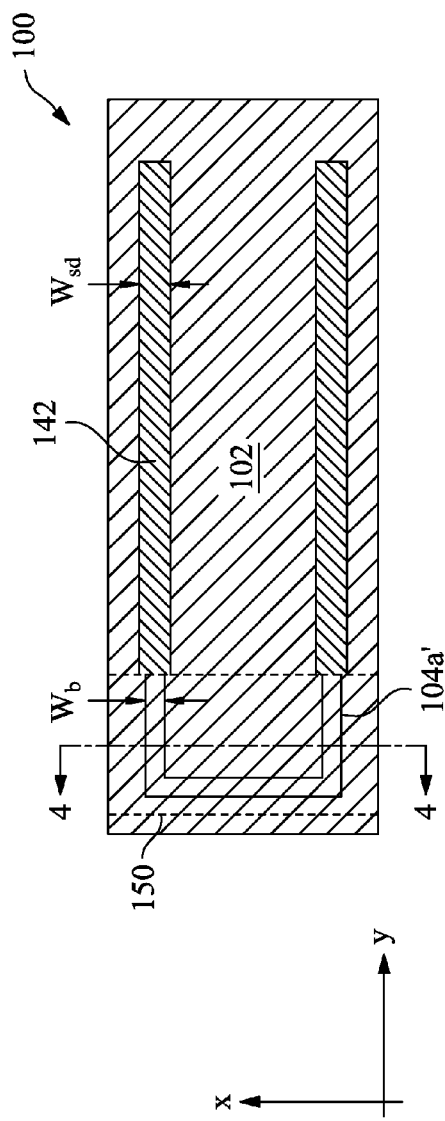
Figure 9B:
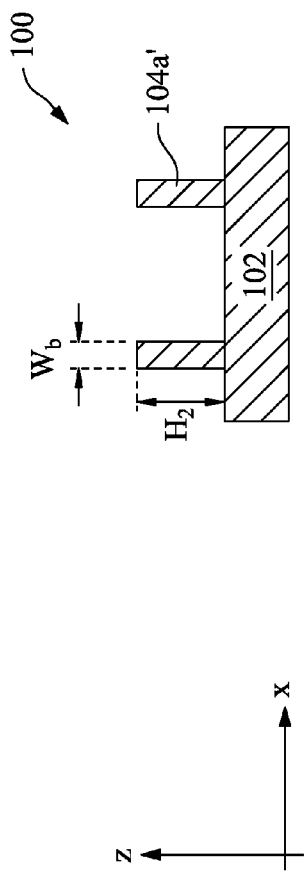

At operation 214a (FIG. 2B), the method 200 trims the other end of the projection 104. Referring to FIGS. 9A and 9B, a portion 104a' of the projection 104, as enclosed by a dotted box 150, is trimmed to have a height $H_2$ and a width $W_b$, wherein $H_2$ is less than $H_1$ and $W_b$ is less than $W_{sd}$. In an embodiment, $W_b$ is about three fifths (⅗) to about two thirds (⅔) of $W_{sd}$. In an embodiment, operation 214a includes a patterning process and one or more etching processes. For example, the patterning process forms a resist pattern covering the substrate 102, the projection 104, and the patterned hard mask 142 except the respective portions enclosed by the dotted box 150. An anisotropic etching process removes the uncovered portion of the patterned hard mask 142 to expose the portion 104a'. Then an isotropic etching process trims the exposed portion 104a', reducing both its width and height.

At operation 216a (FIG. 2B), the method 200 partially cuts the trimmed portion 104a'. Referring to FIGS. 10A and 10B, a portion of the trimmed portion 104a', as enclosed by a dotted box 152, is removed, and the remaining portions of the trimmed portion 104a' become the fin portions 104a.

FIG. 10C is a cross sectional view of the FinFET 100 along the "5-5" line in FIG. 10A. Referring to FIG. 10C, the untrimmed fin portions 104b/c/d are underneath the patterned hard mask 142. In an embodiment, operation 216a includes a patterning process and an etching process, similar to those discussed in operation 212a above. After operation 216a, the fin 104 as shown in FIGS. 1A-1C has been formed.

FIG. 2C provides an alternative embodiment of forming the fin 104 (or a similar fin). FIG. 2C is discussed below in conjunction with FIGS. 11A-12C.

Figure 11A:
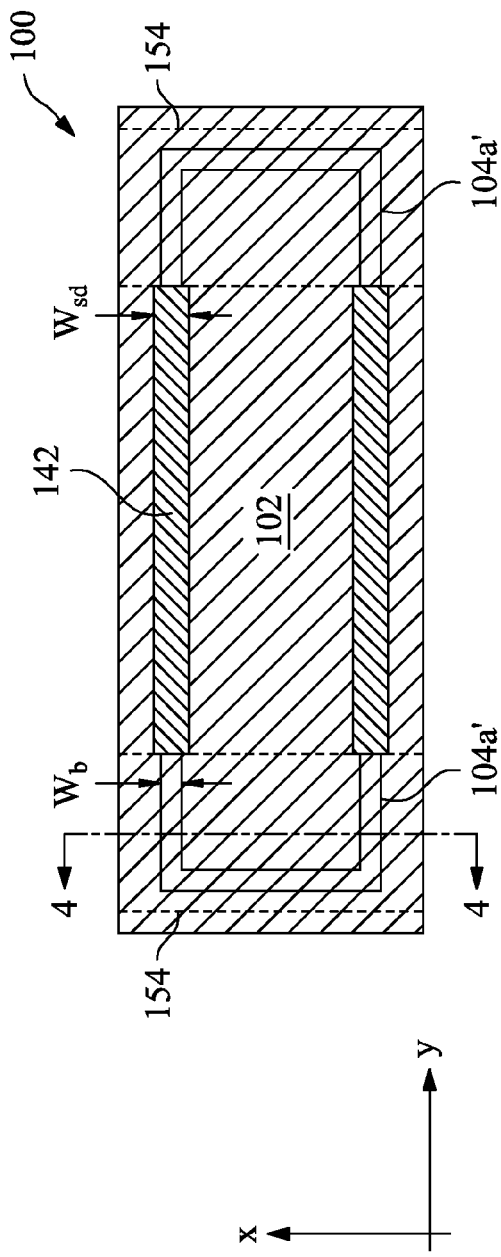
Figure 11B:
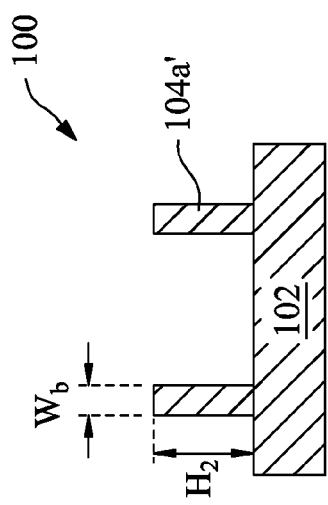

At operation 214b (FIG. 2C), the method 200 trims both ends of the projection 104. Referring to FIGS. 11A and 11B, two portions 104a' of the projection 104, as enclosed by two dotted boxes 154, are trimmed to each have a height $H_2$ and a width $W_b$, wherein $H_2$ is less than $H_1$ and $W_b$ is less than $W_{sd}$. In an embodiment, $W_b$ is about three fifths (⅗) to about two thirds (⅔) of $W_{sd}$. In an embodiment, operation 214b includes a patterning process and one or more etching processes, similar to those discussed in operation 214a above. After operation 214b, the fin 104 includes trimmed portions 104a' and untrimmed portions underneath the patterned hard mask 142, as shown in FIG. 11A.

At operation 216b (FIG. 2C), the method 200 partially cuts the trimmed portions 104a'. Referring to FIGS. 12A and 12B, portions of the trimmed portions 104a', as enclosed by dotted boxes 156, are removed, and the remaining portions of the trimmed portions 104a' become the fin portions 104a. FIG. 12C is a cross sectional view of the FinFET 100 along the "5-5" line in FIG. 12A. Referring to FIG. 12C, the untrimmed fin portions 104b/c/d are underneath the patterned hard mask 142. Specifically, the fin 104 in FIG. 12C has two trimmed ends 104a, making biasing design more flexible, which will be shown later. In an embodiment, operation 216b includes a patterning process and an etching process, similar to those discussed in operation 212a above.

In the present embodiment, the method 200 (FIG. 2C) proceeds from either operation 216a or operation 216b to operation 218 to form an isolation structure 106 over the substrate 102 and around the fin(s) 104 (FIG. 1A). In an embodiment, operation 218 forms the isolation structure 106 by depositing an isolating material over the substrate 102 and covering the fins 104 and the patterned hard mask 142. Then, operation 218 planarizes the isolating material using a CMP process with the patterned hard mask 142 as a CMP stop. Thereafter, operation 218 recesses the isolating material to be lower than a top surface of the fins 104 using an etching process.

In an alternative embodiment, the method 200 may cut both ends of the projection 104 after operation 210 using a process similar to operation 212a, trims the end portions of the resulting fins using a process similar to operation 214a, and thereafter forms the isolation structure 106 using operation 218.

In yet another embodiment, the method 200 may cut both ends of the projection 104 after operation 210 using a process similar to operation 212a, forms the isolation structure 106 using operation 218, and thereafter trims the end portions of the resulting fins using a process similar to operation 214a. To further this embodiment, only the portion of the fins 104 above the isolation structure 106 (see, FIG. 1C) are trimmed. However, the biasing region 104a can still function as an effective body biasing structure.

Various other embodiments of the method 200 in forming the fins 104 including one or more shrunk portions 104a are within the present disclosure.

At operation 220 (FIG. 2C), the method 200 forms a gate structure 108 over the fins 104, as shown in FIGS. 1A-1C.

The gate structure 108 engages the fins 104 adjacent to the channel regions 104c. The gate structure 108 may be formed by various deposition, patterning, and etching processes as discussed above.

At operation 222 (FIG. 2C), the method 200 forms source/drain (S/D) features in the S/D regions 104b and 104d. The S/D features may include lightly doped S/D (LDD) features and heavily doped S/D (HDD) features. For example, LDD features may be formed by light dopant implantation and activation processes, and HDD features may be formed by recess etching and epitaxy processes.

At operation 224 (FIG. 2C), the method 200 forms conductive features 130a-d (FIG. 1D) electrically connecting the biasing region 104a, the S/D regions 104b and 104d, and the gate 108. Various embodiments have been discussed above with reference to FIG. 1D.

At operation 226 (FIG. 2C), the method 200 performs one or more processes to complete the fabrication of the semiconductor device 100. For example, operation 226 may form metal interconnects connecting the conductive features 130a-d to other parts of the semiconductor device 100. Particularly, the conductive feature 130a may be connected to a global or local power routing which is used to apply a biasing voltage on the biasing region 104a.

FIGS. 13-16 show various non-limiting exemplary layout diagrams where the fin back biasing of the present disclosure is used.

Figure 13:
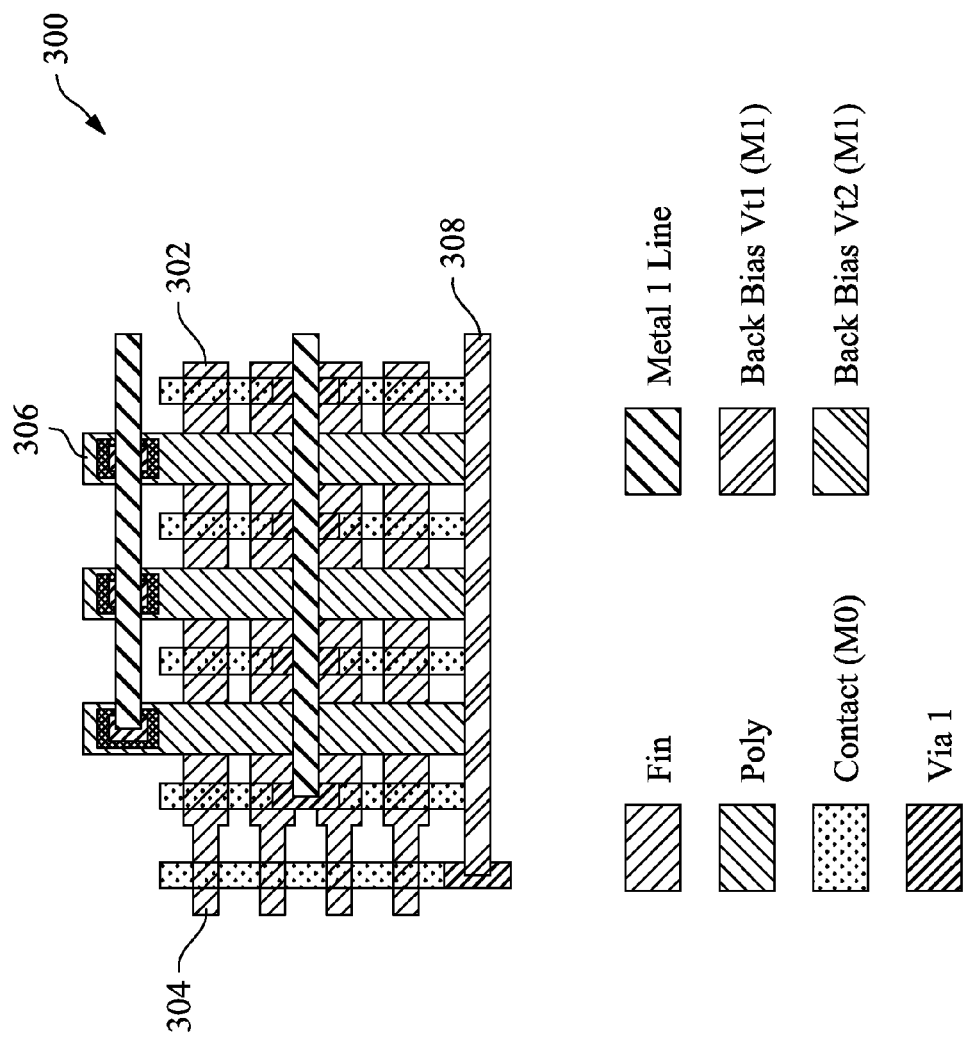
FIGS. 13-16 show layout diagrams of semiconductor devices in accordance with some embodiments.

Referring to FIG. 13, shown therein is an IC layout 300 which includes four fins 302 each having a biasing region 304. Three gates 306 engage the fins 302, forming three FinFETs on each fin and a total of twelve FinFETs. The S/D regions of each FinFET sandwich the respective gate 306. Each biasing region 304 is configured to bias all three FinFETs on the same fin into operation when a voltage is applied across the biasing region 304 and the respective source regions. Furthermore, the four biasing regions 304 are connected to a common terminal 308, sharing a common biasing voltage.

Figure 14:
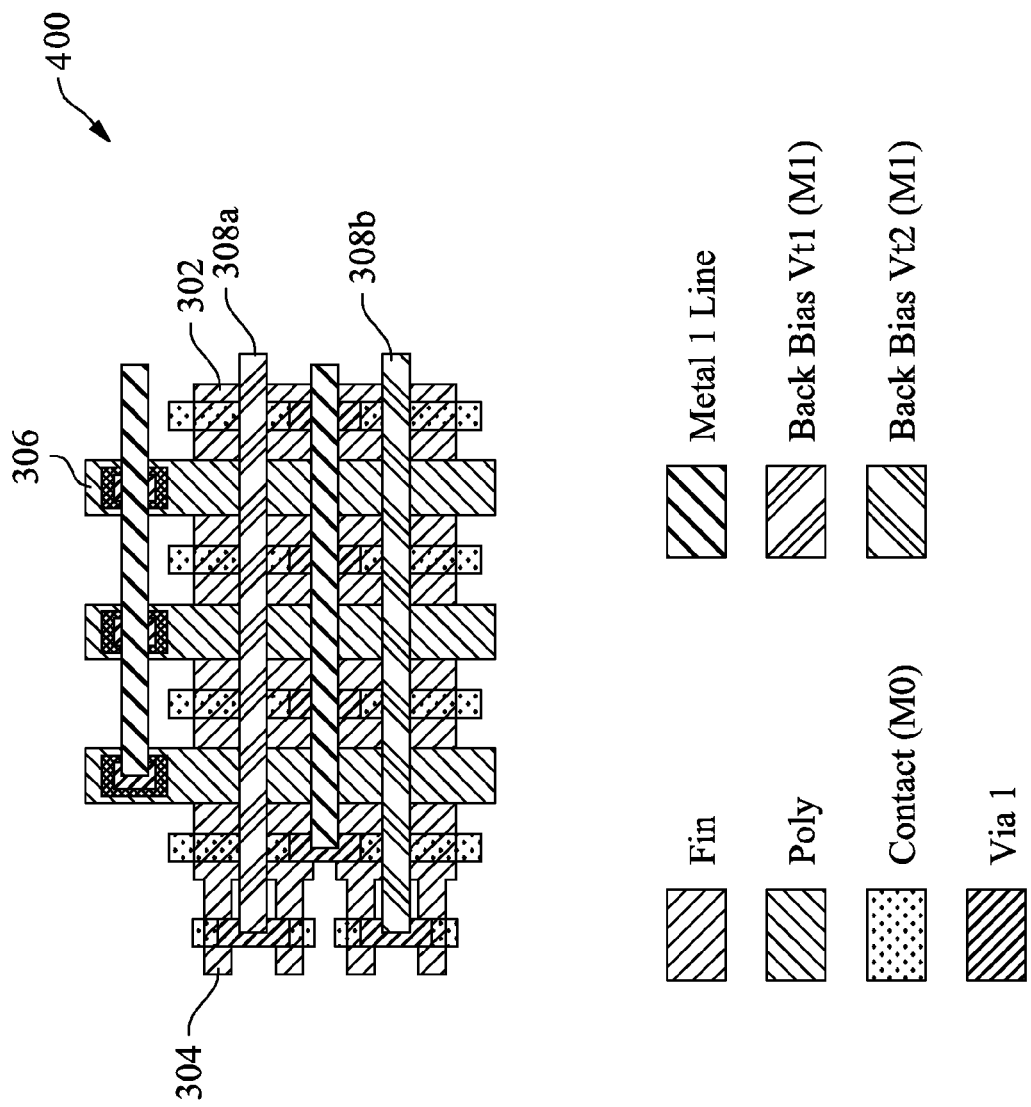

Referring to FIG. 14, shown therein is a layout 400 similar to the layout 300. However, the four fins 302 in the layout 400 are divided into two groups. Two adjacent fins have their respective biasing regions 304 connected to a biasing terminal 308a, and the other two adjacent fins have their respective biasing regions 304 connected to a biasing terminal 308b. The terminals 308a and 308b may connect to different biasing voltages. The layout 400 demonstrates that the fin back biasing of an IC can be flexibly designed and a fin or a group of fins can have an individually tuned biasing voltage.

Figure 15:
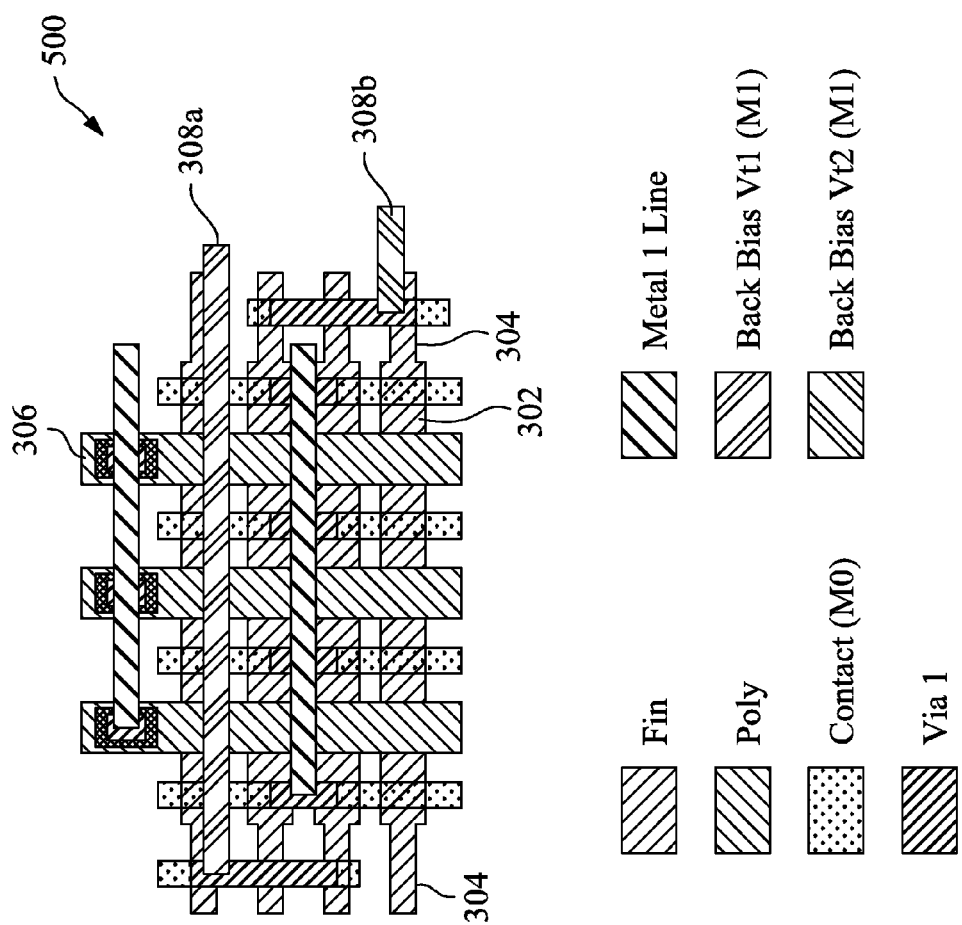

Referring to FIG. 15, shown therein is a layout 500 which includes four fins 302 each having two biasing regions 304, similar to the fins 104 in FIG. 12C. A biasing voltage may be applied to either of the two biasing regions 304 on each fin 302, making the fin back biasing even more flexible than the layout 400. In the example as shown, non-contiguous fins are connected to a common biasing voltage, illustrating the flexibility of the biasing scheme. The other aspects of the layout 500 are similar to the layout 400.

Figure 16:
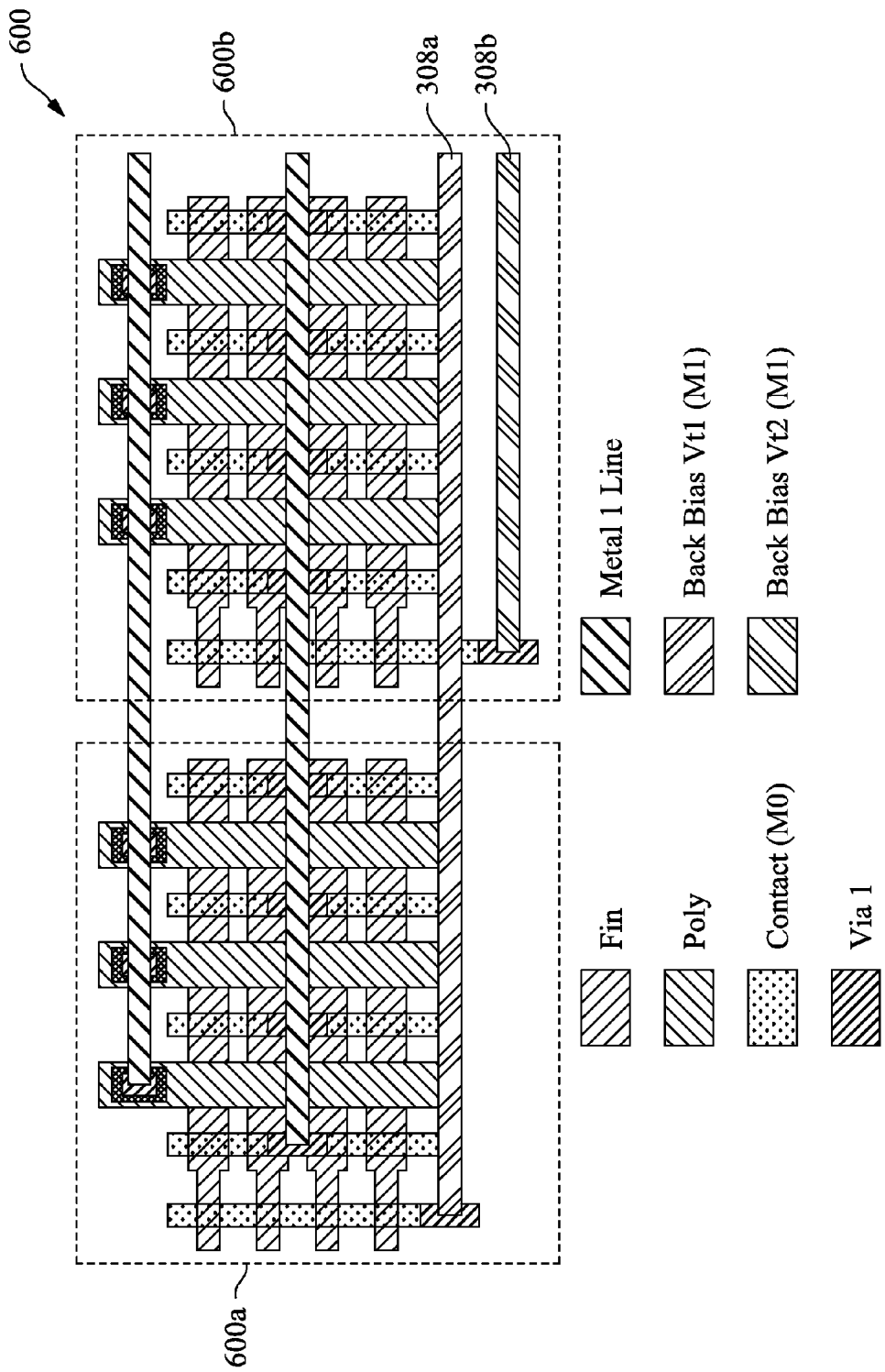

Referring to FIG. 16, shown therein is a layout 600, illustrating a system-on-chip design scheme. The layout 600 includes two blocks, 600a and 600b, each being the same as the layout 300 (FIG. 13). At the system level, the block 600a is biased using a terminal 308a while the block 600b is biased using a terminal 308b. In one example, the block 600a has a low (or high) threshold voltage $V_{t1}$ while the block 600b has a high (or low) threshold voltage $V_{t2}$. Having separate biasing terminals make each block individually adjustable in terms of threshold voltage biasing.

Although not intended to be limiting, one or more embodiments of the present disclosure provide many benefits to a semiconductor device and the formation thereof. For example, embodiments of the present disclosure provide methods for effectively adding body-biasing to a FinFET. FinFET devices constructed according to the present disclosure can have body-biasing effects comparable to those in the traditional planar devices. As another example, an IC having FinFET devices can be constructed to use multiple biasing voltages to individually tune a group of FinFETs or even a single FinFET. Various embodiments of the present disclosure can be easily integrated into existing FinFET fabrication flow.

In one exemplary aspect, the present disclosure is directed to a method of forming a semiconductor device. The method includes forming a fin over a substrate. The fin includes a source region, a drain region, a channel region, and a first region, wherein the source and drain regions sandwich the channel region, and the first region and the channel region sandwich one of the source and drain regions. The method further includes trimming the first region, resulting in a trimmed first region; and forming a gate over the substrate, the gate engaging the fin adjacent to the channel region. In an embodiment, the method further includes forming a first conductive feature electrically connecting the trimmed first region. In a further embodiment, the method includes forming conductive features electrically connecting the source region, the drain region, and the gate respectively.

In an embodiment of the method, the first region is at one end of the fin. In another embodiment of the method, the trimming of the first region includes reducing both a height and a width of the first region. For example, the width of the first region may be reduced by about one third to about two fifths thereof.

In an embodiment, the method further includes, before the forming of the gate, depositing an isolation material to laterally isolate the fin from other structures on the substrate.

In an embodiment of the method, the forming of the fin includes forming a mandrel pattern over a hard mask on the substrate; forming a spacer on sidewalls of the mandrel pattern; removing the mandrel pattern; etching the hard mask using the spacer as an etch mask; etching the substrate using the etched hard mask as an etch mask, thereby forming a projection over the substrate; and removing at least a portion of the projection, wherein a remaining portion of the projection becomes the fin.

In another exemplary aspect, the present disclosure is directed to a method of forming a semiconductor device. The method includes providing a substrate; forming a mandrel pattern over the substrate; forming a spacer on sidewalls of the mandrel pattern; and removing the mandrel pattern, resulting in a spacer pattern over the substrate. The method further includes transferring the spacer pattern to the substrate, thereby forming a projection. The method further includes trimming a portion of the projection, resulting in a trimmed portion of the projection and an untrimmed portion of the projection. The method further includes partially removing the trimmed portion. A remaining portion of the projection becomes a fin that includes a part of the trimmed portion as a first end of the fin and a part of the untrimmed portion as a main body of the fin.

In an embodiment, the method further includes forming a gate engaging the main body of the fin. A further embodiment includes forming two source/drain (S/D) features in the main body of the fin with one S/D feature on each side of the gate. A yet further embodiment includes forming a conductive feature electrically connecting to the first end of the fin.

In an embodiment, the method further includes, before the trimming of the portion of the projection, removing another portion of the projection different from the portion to be trimmed, thereby forming a second end of the fin.

In an embodiment of the method, the trimming of the portion of the projection includes trimming a first portion of the projection and trimming a second portion of the projection; and the partially removing of the trimmed portion includes partially removing the trimmed first portion and partially removing the trimmed second portion In another exemplary aspect, the present disclosure is directed to a semiconductor device. The semiconductor device includes a substrate and a first fin over the substrate. The first fin includes a first source region, a first drain region, a first channel region, and a first biasing region. The first source region and the first drain region sandwich the first channel region. The first channel region and the first biasing region sandwich one of the first source region and the first drain region. The semiconductor device further includes a first gate over the substrate. The first gate engages the first fin adjacent to the first channel region, thereby forming a first field effect transistor (FET). In the semiconductor device, the first biasing region is configured to bias the first FET into operation when a first voltage is applied across the first biasing region and the first source region.

In embodiments, the semiconductor device further includes a first conductive feature electrically connecting to the first biasing region. In an embodiment of the semiconductor device, the first biasing region is at one end of the first fin. In another embodiment, the first channel region and the first biasing region sandwich the first source region.

In embodiments, when viewed along a direction from the first source region to the first drain region, the first source region has a substantially rectangular profile with a first height and first width, and the first biasing region has a substantially rectangular profile with a second height and a second width. The second height is less than the first height, and the second width is less than the first width. In an example, the second width is about three fifths (3/5) to about two thirds (2/3) of the first width.

In an embodiment of the semiconductor device, the first fin further includes a second source region, a second drain region, and a second channel region between the second source region and the second drain region. The second channel region and the first biasing region sandwich one of the second source region and the second drain region. To further this embodiment, the semiconductor device further includes a second gate over the substrate. The second gate engages the first fin adjacent to the second channel region, thereby forming a second field effect transistor (FET). In this embodiment, the first biasing region is configured to bias both the first and the second FETs into operation when the first voltage is applied across the first biasing region and the first and second source regions.

In an embodiment, the semiconductor device further includes a second fin over the substrate. The second fin includes a second source region, a second drain region, a second channel region, and a second biasing region. The second source region and the second drain region sandwich the second channel region. The second channel region and the second biasing region sandwich one of the second source region and the second drain region. The semiconductor device further includes a second gate over the substrate. The second gate engages the second fin adjacent to the second channel region, thereby forming a second FET. In this embodiment, the second biasing region is configured to bias the second FET into operation when a second voltage is applied across the second biasing region and the second source region. The first and second voltages are different.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a fin over a substrate, the fin having a source region, a drain region, a channel region, and a first region, wherein the source and drain regions sandwich the channel region, and the first region and the channel region sandwich one of the source and drain regions;
    trimming the first region, resulting in a trimmed first region; and
    forming a gate over the substrate, the gate engaging the fin adjacent to the channel region.

2. The method of claim 1, further comprising:
    forming a first conductive feature electrically connecting the trimmed first region.

3. The method of claim 2, further comprising:
    forming conductive features electrically connecting the source region, the drain region, and the gate respectively.

4. The method of claim 1, wherein the first region is at one end of the fin.

5. The method of claim 1, wherein the trimming of the first region includes reducing both a height and a width of the first region.

6. The method of claim 5, wherein the width of the first region is reduced by about one third to about two fifths thereof.

7. The method of claim 1, further comprising, before the forming of the gate:
    depositing an isolation material to laterally isolate the fin from other structures on the substrate.

8. The method of claim 1, wherein the forming of the fin includes:
    forming a mandrel pattern over a hard mask on the substrate;
    forming a spacer on sidewalls of the mandrel pattern;
    removing the mandrel pattern;
    etching the hard mask using the spacer as an etch mask;
    etching the substrate using the etched hard mask as an etch mask, thereby forming a projection over the substrate; and
    removing at least a portion of the projection, wherein a remaining portion of the projection becomes the fin.

9. A method of forming a semiconductor device, comprising:
    providing a substrate;
    forming a mandrel pattern over the substrate;
    forming a spacer on sidewalls of the mandrel pattern;
    removing the mandrel pattern, resulting in a spacer pattern over the substrate;

transferring the spacer pattern to the substrate, thereby forming a projection;

trimming a portion of the projection, resulting in a trimmed portion of the projection and an untrimmed portion of the projection; and partially removing the trimmed portion, wherein a remaining portion of the projection becomes a fin that includes a part of the trimmed portion as a first end of the fin and a part of the untrimmed portion as a main body of the fin.

10. The method of claim 9, further comprising:
forming a gate engaging the main body of the fin.

11. The method of claim 10, further comprising:
forming two source/drain (S/D) features in the main body of the fin with one S/D feature on each side of the gate.

12. The method of claim 11, further comprising:
forming a conductive feature electrically connecting to the first end of the fin.

13. The method of claim 9, further comprising, before the trimming of the portion of the projection:
removing another portion of the projection different from the portion to be trimmed, thereby forming a second end of the fin.

14. The method of claim 9, wherein:
the trimming of the portion of the projection includes trimming a first portion of the projection and trimming a second portion of the projection; and
the partially removing of the trimmed portion includes partially removing the trimmed first portion and partially removing the trimmed second portion.

15. A method of forming a semiconductor device, comprising:
forming a projection out of a semiconductor substrate;
trimming a first portion of the projection by reducing a height and a width of the first portion, resulting in a trimmed first portion;
forming a gate over the substrate and engaging the projection at an untrimmed portion;
forming a first conductive feature electrically connecting to the trimmed first portion; and
trimming a second portion of the projection, resulting in a trimmed second portion, wherein the untrimmed portion is between the trimmed first and second portions along the Projection lengthwise.

16. The method of claim 15, wherein the trimming of the first portion reduces the width of the first portion by one third to two fifths.

17. The method of claim 15, wherein the projection is physically connected to another projection out of the semiconductor substrate through the trimmed first and second portions, further comprising:
partially removing the trimmed first and second portions, thereby disconnecting the projection from the another projection.

18. The method of claim 15, further comprising:
forming a second conductive feature electrically connecting to the trimmed second portion.

19. The method of claim 15, wherein the projection is physically connected to another projection out of the semiconductor substrate through the trimmed first portion, further comprising:
partially removing the trimmed first portion, thereby disconnecting the projection from the another projection.

20. The method of claim 15, wherein the trimming of the second portion reduces the width of the second portion by one third to two fifths.

* * * * *